(12) United States Patent
Tanaka et al.

(10) Patent No.: US 10,534,038 B2
(45) Date of Patent: Jan. 14, 2020

(54) METHOD AND SYSTEM FOR ESTIMATING STATE OF CHARGE OR DEPTH OF DISCHARGE OF BATTERY, AND METHOD AND SYSTEM FOR EVALUATING HEALTH OF BATTERY

(71) Applicant: Japan Aerospace Exploration Agency, Tokyo (JP)

(72) Inventors: Kohei Tanaka, Tokyo (JP); Yoshitsugu Sone, Hachioji (JP); Seisuke Fukuda, Machida (JP); Masayuki Itagaki, Tokyo (JP)

(73) Assignee: Japan Aerospace Exploration Agency, Tokyo (JP)

( * ) Notice: Subject to any disclaimer, the term of this patent is extended or adjusted under 35 U.S.C. 154(b) by 0 days.

(21) Appl. No.: 15/739,566

(22) PCT Filed: Jun. 24, 2016

(86) PCT No.: PCT/JP2016/068904
§ 371 (c)(1),
(2) Date: Dec. 22, 2017

(87) PCT Pub. No.: WO2016/208745
PCT Pub. Date: Dec. 29, 2016

(65) Prior Publication Data
US 2018/0321326 A1 Nov. 8, 2018

(30) Foreign Application Priority Data

Jun. 26, 2015 (JP) ................................. 2015-129293

(51) Int. Cl.
*G01N 27/416* (2006.01)
*G01R 31/389* (2019.01)
(Continued)

(52) U.S. Cl.
CPC ......... *G01R 31/389* (2019.01); *G01R 31/367* (2019.01); *G01R 31/387* (2019.01);
(Continued)

(58) Field of Classification Search
CPC .. G01R 31/36; G01R 31/3833; G01R 31/387; G01R 31/389; G01R 31/392;
(Continued)

(56) References Cited

U.S. PATENT DOCUMENTS 8,754,611 B2 * 6/2014 Greening .......... H01M 10/0525
320/112
9,354,278 B2 * 5/2016 Koba .................... G01R 31/389
(Continued)

FOREIGN PATENT DOCUMENTS

JP  2003-291754 A  10/2003
JP  2011-158444 A  8/2011
(Continued)

OTHER PUBLICATIONS

Written Opinion issued in PCT/JP2016/068904; dated Sep. 6, 2016.
(Continued)

*Primary Examiner* — Vinh P Nguyen
(74) *Attorney, Agent, or Firm* — Studebaker & Brackett PC

(57) ABSTRACT

It is intended to recognize the state of charge or depth of discharge of the battery more accurately than conventional technologies and to recognize health of a battery appropriately. Complex impedance between positive and negative electrodes of the battery is determined at a plurality of frequencies, and the state of charge or depth of discharge of the battery is estimated by comparing frequency dependency of Warburg impedance of the determined complex impedances with frequency dependency of Warburg impedance corresponding to a known state of charge or depth of
(Continued)

discharge of the battery. Similarly, complex impedance is determined, and the health of the battery is evaluated by using the real part of the complex impedance at a point where the imaginary part of the complex impedance is zero on a line obtained by extending a part, which indicates frequency dependency of Warburg impedance, of a complex impedance characteristic curve representing a correlation relationship between the real and imaginary parts of the determined complex impedance.

20 Claims, 8 Drawing Sheets

(51) Int. Cl.
| | |
|---|---|
| *G01R 31/387* | (2019.01) |
| *G01R 31/392* | (2019.01) |
| *G01R 31/3832* | (2019.01) |
| *H01M 10/48* | (2006.01) |
| *G01R 31/367* | (2019.01) |
| *H02J 7/00* | (2006.01) |
| *G01R 31/3842* | (2019.01) |
| *H01M 10/42* | (2006.01) |
| *H01M 10/0525* | (2010.01) |

(52) U.S. Cl.
CPC ..... *G01R 31/3833* (2019.01); *G01R 31/3842* (2019.01); *G01R 31/392* (2019.01); *H01M 10/425* (2013.01); *H01M 10/48* (2013.01); *H02J 7/0047* (2013.01); *H01M 10/0525* (2013.01); *H01M 2010/4271* (2013.01)

(58) Field of Classification Search
CPC .......... H01M 10/0525; H01M 10/425; H01M 10/48; H01M 2010/4271
See application file for complete search history.

(56) References Cited

U.S. PATENT DOCUMENTS

| | | | |
|---|---|---|---|
| 9,849,793 B2* | 12/2017 | Tashiro | ................ H02J 7/0029 |
| 2016/0069963 A1 | 3/2016 | Hebiguchi | |
| 2016/0236581 A1 | 8/2016 | Tashiro et al. | |

FOREIGN PATENT DOCUMENTS

| | | |
|---|---|---|
| JP | 2015-076958 A | 4/2015 |
| WO | 2015/005141 A1 | 1/2015 |

OTHER PUBLICATIONS

International Search Report issued in PCT/JP2016/068904; dated Sep. 6, 2016.
Tanaka et al.; "Toward state estimation of satellite-borne Lithium-ion battery based on impedance data using load current changing"; pp. 1-3.

* cited by examiner

COMPLEX IMPEDANCE CHARACTERISTIC
DETERMINATION UNIT

METHOD AND SYSTEM FOR ESTIMATING STATE OF CHARGE OR DEPTH OF DISCHARGE OF BATTERY, AND METHOD AND SYSTEM FOR EVALUATING HEALTH OF BATTERY

TECHNICAL FIELD

The present invention relates to a method and a system for safely performing charging and discharging of a battery while estimating the state of charge or depth of discharge of the battery and feeding back to controlling. The present invention also relates to a method and a system for safely performing operation of a battery while evaluating the health of the battery and feeding back to controlling.

BACKGROUND ART

Secondary batteries are widely used in a household stationary electrical storage device, an electric vehicle power source, a personal computer, a satellite, and the like. However, secondary batteries are known to be prone to solution leakage due to overcharging and failure due to overdischarging, and thus required to be operated based on appropriate recognition of the state of charge or depth of discharge. For primary batteries, too, operation based on recognition of the depth of discharge is effective in, for example, determination of a replacement timing.

Typically, the state of charge of a battery has been managed by measuring the voltage of the battery in an energized or opened state (Patent Literature 1). This is because the voltage of a conventional battery tends to gradually decrease with discharging and thus it is possible to recognize the state of discharge from a reached voltage. For some batteries, however, it is difficult to estimate the state of discharge only from voltage.

Recent progress of battery development has been accelerating the tendency to request high safety. Known examples of batteries particularly focused on safety include a battery in which ionic liquid is used as electrolytic solution and a battery including an electrode made of a material with limited oxygen generation. These batteries are also needed to be operated based on appropriate recognition of the state of charge or depth of discharge to avoid solution leakage due to overcharging and failure due to overdischarging.

The operation of a battery also requires appropriate recognition of the health of the battery in addition to the state of charge or depth of discharge. Operation of a battery having a degraded health potentially results in serious accidents such as firing and explosion.

CITATION LIST

Patent Literature

Patent Literature 1: Japanese Patent Laid-Open No. 2003-291754

SUMMARY OF INVENTION

Technical Problem

The present invention is intended to provide a method and a system for enabling estimation of the state of charge and discharge of a battery when it is impossible to estimate the state of charge and discharge by a conventional method, and is also intended to provide a method and a system for appropriately recognizing the health of the battery.

Solution to Problem

To solve the above-described problem, the present invention discloses, as novel methods, a method of estimating the state of charge or depth of discharge of a battery focusing on the internal resistance thereof, a method of controlling charging and discharging based on this estimated state of charge and discharge, and a related system. The present invention provides a method capable of performing a charge and discharge state analysis based on data related to internal resistance acquired for the battery on board (state of being mounted on a moving object such as an automobile or a satellite, or state of the battery being used in any other arbitrary situation) and feeding back a result of the analysis to controlling.

The present invention teaches charging and discharging management method and system that understand the state of charge of a battery from alternating-current impedance information obtained as a response characteristic to an on-board alternating-current impedance measuring function or a pulse load, and from direct-current resistance, and feed back to controlling.

It is possible to manage the state of charge (hereinafter also referred to as the "SOC") by a method (hereinafter also referred to as a "current integrating method") of integrating current and obtaining the state of charge by calculation. However, a method using impedance, which is suggested by the present invention, can be used in an environment where the current integrating method cannot be used, or can be used as a method for complementing the current integrating method to achieve an improved accuracy.

Specifically, the present invention provides a method including: determining complex impedance between positive and negative electrodes of a battery at a plurality of frequencies; and estimating a state of charge or depth of discharge of the battery by comparing frequency dependency of Warburg impedance of the determined complex impedance with frequency dependency of Warburg impedance corresponding to a known state of charge or depth of discharge of the battery.

In the above-described method according to the present invention, the estimation of the state of charge or depth of discharge may be performed by comparing, in a frequency domain lower than a frequency domain of Warburg impedance, frequency dependency of the determined complex impedance with frequency dependency of the complex impedance corresponding to a known state of charge or depth of discharge in addition to the comparison of frequency dependency of Warburg impedance.

The present inventors have found, in measurement of the complex impedance of a battery, that Warburg impedance in a low frequency domain in which diffusion is dominant and complex impedance in a frequency domain lower than the frequency domain of Warburg impedance exhibit different frequency dependencies in different states of charge (SOC; the ratio of the current charged charge amount relative to a charged charge amount when the battery is fully charged) and depths of discharge (DOD; the ratio of the current discharged charge amount relative to a charge amount that can be discharged). This phenomenon can be exploited to estimate the state of charge and depth of discharge of the battery based on the frequency dependency of the measured complex impedance. Typically, the frequency dependency of complex impedance corresponding to a known state of charge or depth of discharge is measured in advance, and a result of the measurement is stored as a catalog. Then, the frequency dependency of the measured complex impedance of a battery, the state of charge or depth of discharge of which is unknown is compared with the catalog in the frequency domain of Warburg impedance and a lower frequency domain, enabling to estimate the state of charge or depth of discharge of the battery.

The phenomenon that the frequency dependency of complex impedance in the frequency domain of Warburg impedance and the lower frequency domain changes in accordance with the state of charge or depth of discharge is estimated to occur not only to a particular battery exemplarily described in an embodiment to be described later but also to any arbitrary battery. This is because this impedance characteristic response is a phenomenon attributable to a battery discharging curve on which electric potential variation along with capacity change is large in a region in which the state of charge is high or low, and it is thought that a similar phenomenon occurs to every general batteries. Thus, the present invention is applicable to an arbitrary battery (including not only a secondary battery but also a primary battery). The primary battery is initially inactive at the start of discharging in some cases, which makes it difficult to determine impedance. On the other hand, toward the end of discharging, it becomes possible to determine a correlation between the state of charge and the impedance as described above. In the secondary battery, in particular, voltage change in accordance with the state of charge transits stably, which leads to expectation of a more significant effect.

The above-described method according to the present invention may further include estimating a degradation state of the battery by determining direct-current resistance of the battery. Estimating the state of charge or depth of discharge of the battery may be performed by comparing frequency dependency of the determined complex impedance with frequency dependency of complex impedance corresponding to a known state of charge or depth of discharge of the battery corresponding to the estimated degradation state.

Since the frequency dependency of complex impedance can change with the degradation state of a battery, it is preferable to use, as a catalog representing the frequency dependency of complex impedance corresponding to a known state of charge or depth of discharge, a catalog produced right before measurement of the complex impedance of a battery, the state of charge or depth of discharge of which is unknown, as far as possible. Alternatively, a catalog corresponding to a known state of charge or depth of discharge is produced in accordance with each degradation state estimated from a direct-current resistance value of the battery. Then, the direct-current resistance of a battery, the state of charge or depth of discharge of which is unknown is measured to use a catalog corresponding to a degradation state estimated from the direct-current resistance. In this manner, the estimation of the state of charge or depth of discharge can be performed at an improved accuracy.

The above-described method according to the present invention may further include controlling charging by a charging source connected with the battery or controlling electric power consumption at a electric power consuming element connected with the battery depending on the estimated state of charge or depth of discharge of the battery. For example, when the estimated state of charge exceeds a predetermined level, overcharging can be prevented by performing control to stop charging by the charging electric source. Alternatively, when the estimated depth of discharge exceeds a predetermined level, overdischarging can be prevented by performing, for example, control to cut off connection between the battery and the electric power consuming element such as an instrument configured to operate with electric power from the battery.

The present invention also provides a method including: determining complex impedance between positive and negative electrodes of a battery at a plurality of frequencies; and estimating a state of charge or depth of discharge of the battery by comparing frequency dependency of complex impedance at a frequency equal to or lower than approximately 100 mHz of the determined complex impedance with frequency dependency of complex impedance corresponding to a known state of charge or depth of discharge of the battery at a frequency equal to or lower than approximately 100 mHz. Estimating the state of charge or depth of discharge of the battery may be performed by comparing frequency dependency of complex impedance at a frequency equal to or lower than approximately 10 mHz of the determined complex impedance with frequency dependency of complex impedance corresponding to a known state of charge or depth of discharge of the battery at a frequency equal to or lower than approximately 10 mHz.

As indicated by experiment results such as graphs illustrated in FIGS. 3 and 4 in the embodiment to be described later, difference in the complex impedance of a battery according to the states of charge or depths of discharge is large in a frequency domain equal to or lower than 100 mHz (preferably, 10 mHz), in particular, in some cases. Thus, it is effective to focus on this frequency domain equal to or lower than 100 mHz, in particular, equal to or lower than 10 mHz in estimation of the state of charge or depth of discharge of such a battery.

The present invention also provides a method including determining complex impedance between positive and negative electrodes of a battery at a plurality of frequencies; and estimating a state of charge or depth of discharge of the battery by comparing, on a lower frequency side than a frequency at which change of the imaginary part along with increase of the real part of a complex impedance characteristic curve representing a correlation relationship between the real and imaginary parts of the determined complex impedance makes transition from decrease to increase, the complex impedance characteristic curve with a complex impedance characteristic curve corresponding to a known state of charge or depth of discharge of the battery.

As indicated by experiment results such as the graphs illustrated in FIGS. 3 and 4 in the embodiment to be described later, change of the complex impedance characteristic curve in accordance with the state of charge or depth of discharge is significant on a lower frequency side than a point (point P in FIGS. 3 and 4) at which a complex impedance characteristic curve having the real part of the complex impedance as an abscissa value and the imaginary part of the complex impedance as an ordinate value makes transition from decrease to increase. The state of charge or depth of discharge of the battery can be estimated at a high accuracy by comparing the complex impedance characteristic curve with a catalog as described above in such a frequency domain.

The present invention also provides a method including: determining differential capacity of a battery; and estimating a state of charge or depth of discharge of the battery by comparing the determined differential capacity with dependency of the differential capacity of the battery on the state of charge or depth of discharge. The state of charge or depth of discharge can be estimated based only on the dependency of the differential capacity on the state of charge or depth of discharge, independently from the above-described method exploiting the frequency dependency of complex impedance. And, even if it is difficult to accurately estimate the state of charge or depth of discharge only from the frequency characteristic of complex impedance, the differential capacity can be used to improve the accuracy of the estimation.

The present invention also provides a method including: determining complex impedance between positive and negative electrodes of a battery at a plurality of frequencies; and evaluating health of the battery by using the real part of the complex impedance at a point where the imaginary part of the complex impedance is zero on a line obtained by extending a part, which indicates frequency dependency of Warburg impedance, of a complex impedance characteristic curve representing a correlation relationship between the real and imaginary parts of the determined complex impedance. For example, the health of the battery can be evaluated based on temporal change in the real part of the complex impedance at the point where the imaginary part is zero (this is same in methods or systems described below).

The present invention also provides a method including: determining complex impedance between positive and negative electrodes of a battery at a plurality of frequencies; and evaluating health of the battery by using the real part of the complex impedance at a point where the imaginary part of the complex impedance is zero on a line obtained by extending a part, which indicates frequency dependency of complex impedance at a frequency equal to or lower than approximately 100 mHz, of a complex impedance characteristic curve representing a correlation relationship between the real and imaginary parts of the determined complex impedance.

The present invention also provides a method including: determining complex impedance between positive and negative electrodes of a battery at a plurality of frequencies; and evaluating health of the battery by using the real part of the complex impedance at a point where the imaginary part of the complex impedance is zero on a line obtained by extending a part, on a lower frequency side than a frequency at which change of the imaginary part along with increase of the real part makes transition from decrease to increase, of the complex impedance characteristic curve representing a correlation relationship between the real and imaginary parts of the determined complex impedance.

It is thought that the real part of complex impedance determined as described above in the methods of evaluating the health of a battery according to the present invention corresponds to the total internal resistance of the battery. Thus, the health of the battery can be evaluated by knowing it. For example, evaluating the health of the battery in these methods may include determining that the health of the battery has degraded based on decrease of the real part of the complex impedance at the point where the imaginary part of the complex impedance is zero. The decrease of the real part of the complex impedance is determined to be a sign of short circuit inside of the battery, and thus it can be determined that the health of the battery has degraded when the real part has decreased as compared to that in the past. When the real part of the complex impedance, which normally keeps increasing, indicates decrease tendency, this situation can be associated with determination that "the health has degraded" and "tendency indicating short circuit is observed", thereby achieving safety (for example, stopping operation or replacing the battery).

Information equivalent to the above-described information for evaluating the health of the battery can be obtained, as a resistance component inside of the battery by calculation, by establishing an equivalent circuit simulating inside of the battery for the complex impedance and by performing fitting of impedance information using this circuit.

In addition, it can be obtained based on the real part of the complex impedance at a point where the imaginary part is zero on a line obtained by performing fitting of a semi arc-like part obtained when the complex impedance is expressed in a diagram spanned by the real and imaginary parts and by extending the fitted part.

That is, the present invention provides a method including determining complex impedance between positive and negative electrodes of a battery at a plurality of frequencies; and evaluating health of the battery by using the real part of the complex impedance at a point where the imaginary part of the complex impedance is zero on a line obtained by extending a part, on a higher frequency side than a frequency at which change of the imaginary part along with increase of the real part makes transition from decrease to increase, of a complex impedance characteristic curve representing a correlation relationship between the real and imaginary parts of the determined complex impedance. The present invention also provides a method including; determining complex impedance between positive and negative electrodes of a battery at a plurality of frequencies; and evaluating health of the battery by using a resistance component inside of the battery obtained by establishing an equivalent circuit simulating inside of the battery for the determined complex impedance and by performing calculation through fitting of impedance information using the equivalent circuit.

The methods of evaluating the health of a battery taught by the present invention may further include controlling operation of the battery in accordance with the evaluated health of the battery. For example, when it is determined that the real part of the complex impedance has decreased and the health has degraded as described above, it is effective to stop operation of the battery to prevent short circuit from occurring.

The present invention also provides a system including: a complex impedance characteristic determination unit configured to determine complex impedance between positive and negative electrodes of a battery at a plurality of frequencies; and a complex impedance characteristic comparison unit configured to estimate a state of charge or depth of discharge of the battery by comparing frequency dependency of Warburg impedance of the determined complex impedance with frequency dependency of Warburg impedance corresponding to a known state of charge or depth of discharge of the battery.

The present invention also provides a system including: a complex impedance characteristic determination unit configured to determine complex impedance between positive and negative electrodes of a battery at a plurality of frequencies; and a complex impedance characteristic comparison unit configured to estimate a state of charge or depth of discharge of the battery by comparing frequency dependency of complex impedance at a frequency equal to or lower than approximately 100 mHz of the determined complex impedance with frequency dependency of complex impedance corresponding to a known state of charge or depth of discharge of the battery at a frequency equal to or lower than approximately 100 mHz. The complex impedance characteristic comparison unit may be configured to estimate the state of charge or depth of discharge of the battery by comparing frequency dependency of complex impedance at a frequency equal to or lower than approximately 10 mHz of the determined complex impedance with frequency dependency of complex impedance corresponding to a known state of charge or depth of discharge of the battery at a frequency equal to or lower than approximately 10 mHz.

The present invention also provides a system including: a complex impedance characteristic determination unit configured to determine complex impedance between positive and negative electrodes of a battery at a plurality of frequencies; and a complex impedance characteristic comparison unit configured to estimate a state of charge or depth of discharge of the battery by comparing, on a lower frequency side than a frequency at which change of the imaginary part along with increase of the real part of a complex impedance characteristic curve representing a correlation relationship between the real and imaginary parts of the determined complex impedance makes transition from decrease to increase, the complex impedance characteristic curve with a complex impedance characteristic curve corresponding to a known state of charge or depth of discharge of the battery.

The present invention also provides a system including: a differential capacity determination unit configured to determine differential capacity of a battery; and a differential capacity comparison unit configured to estimate a state of charge or depth of discharge of the battery by comparing the determined differential capacity with dependency of the differential capacity of the battery on the state of charge or depth of discharge.

The present invention also provides a system including: a complex impedance characteristic determination unit configured to determine complex impedance between positive and negative electrodes of a battery at a plurality of frequencies; and a health evaluation unit configured to evaluate health of the battery by using the real part of the complex impedance at a point where the imaginary part of the complex impedance is zero on a line obtained by extending a part, which indicates frequency dependency of Warburg impedance, of a complex impedance characteristic curve representing a correlation relationship between the real and imaginary parts of the determined complex impedance.

The present invention also provides a system including: a complex impedance characteristic determination unit configured to determine complex impedance between positive and negative electrodes of a battery at a plurality of frequencies; and a health evaluation unit configured to evaluate health of the battery by using the real part of the complex impedance at a point where the imaginary part of the complex impedance is zero on a line obtained by extending a part, which indicates frequency dependency of complex impedance at a frequency equal to or lower than approximately 100 mHz, of a complex impedance characteristic curve representing a correlation relationship between the real and imaginary parts of the determined complex impedance.

The present invention also provides a system including: a complex impedance characteristic determination unit configured to determine complex impedance between positive and negative electrodes of a battery at a plurality of frequencies; and a health evaluation unit configured to evaluate health of the battery by using the real part of the complex impedance at a point where the imaginary part of the complex impedance is zero on a line obtained by extending a part, on a lower frequency side than a frequency at which change of the imaginary part along with increase of the real part makes transition from decrease to increase, of the complex impedance characteristic curve representing a correlation relationship between the real and imaginary parts of the determined complex impedance.

The present invention also provides a system including: a complex impedance characteristic determination unit configured to determine complex impedance between positive and negative electrodes of a battery at a plurality of frequencies; and a health evaluation unit configured to evaluate health of the battery by using the real part of the complex impedance at a point where the imaginary part of the complex impedance is zero on a line obtained by extending a part, on a higher frequency side than a frequency at which change of the imaginary part along with increase of the real part makes transition from decrease to increase, of a complex impedance characteristic curve representing a correlation relationship between the real and imaginary parts of the determined complex impedance. In addition, the present invention provides a system including: a complex impedance characteristic determination unit configured to determine complex impedance between positive and negative electrodes of a battery at a plurality of frequencies; and a health evaluation unit configured to evaluate health of the battery by using a resistance component inside of the battery obtained by establishing an equivalent circuit simulating inside of the battery for the determined complex impedance and by performing calculation through fitting of impedance information using the equivalent circuit.

Advantageous Effects of Invention

The present invention enables estimation of the state of charge and discharge of a battery based on the frequency dependency and differential capacity of the complex impedance in a low frequency domain, even if it is impossible to estimate the state of charge and discharge by a conventional method such as a method based on a measured voltage value.

Appropriate management of the state of charge and discharge of a battery is a common problem to various instruments and systems such as a mobile computer, an electric vehicle, a stationary electrical storage device, and a spacecraft, and thus methods and systems according to the present invention are a highly expansive technology having wide marketability in industrial usage.

The present invention also enables evaluation of the health of a battery by exploiting a complex impedance characteristic curve. Accordingly, it is possible to early detect health degradation such as short circuit occurring inside of the battery, thereby preventing accidents such as firing and explosion from occurring.

DESCRIPTION OF EMBODIMENT

The following describes, with reference to the accompanying drawings, a method and a system according to the present invention for estimating the state of charge or depth of discharge of a battery and performing feedback control of charging and discharging operation, and a method and a system for evaluating the health of the battery by using a complex impedance characteristic curve and controlling operation of the battery. The methods and systems according to the present invention are not limited to any particular specific configuration described with reference to each drawing, but may be modified as appropriate without departing from the scope of the present invention. For example, a device or method that determines the complex impedance of a battery is not limited to that described later but is arbitrary, and the configuration of a system configured to control a battery based on a complex impedance characteristic is not limited to configurations to be described later with reference to FIGS. 2 and 7 but is arbitrary (Any charging and discharging control unit or operation control unit is not required when no feedback control is performed on charging and discharging operation and the state of operation in systems illustrated in FIGS. 2 and 7). Although an embodiment below describes an example in which a secondary battery is mainly used as a battery, the methods and systems according to the present invention are applicable to any battery including a primary battery as described above, and it is possible to perform discharge depth estimation, battery health evaluation, and control based thereon in the similar principle.

Figure 2:
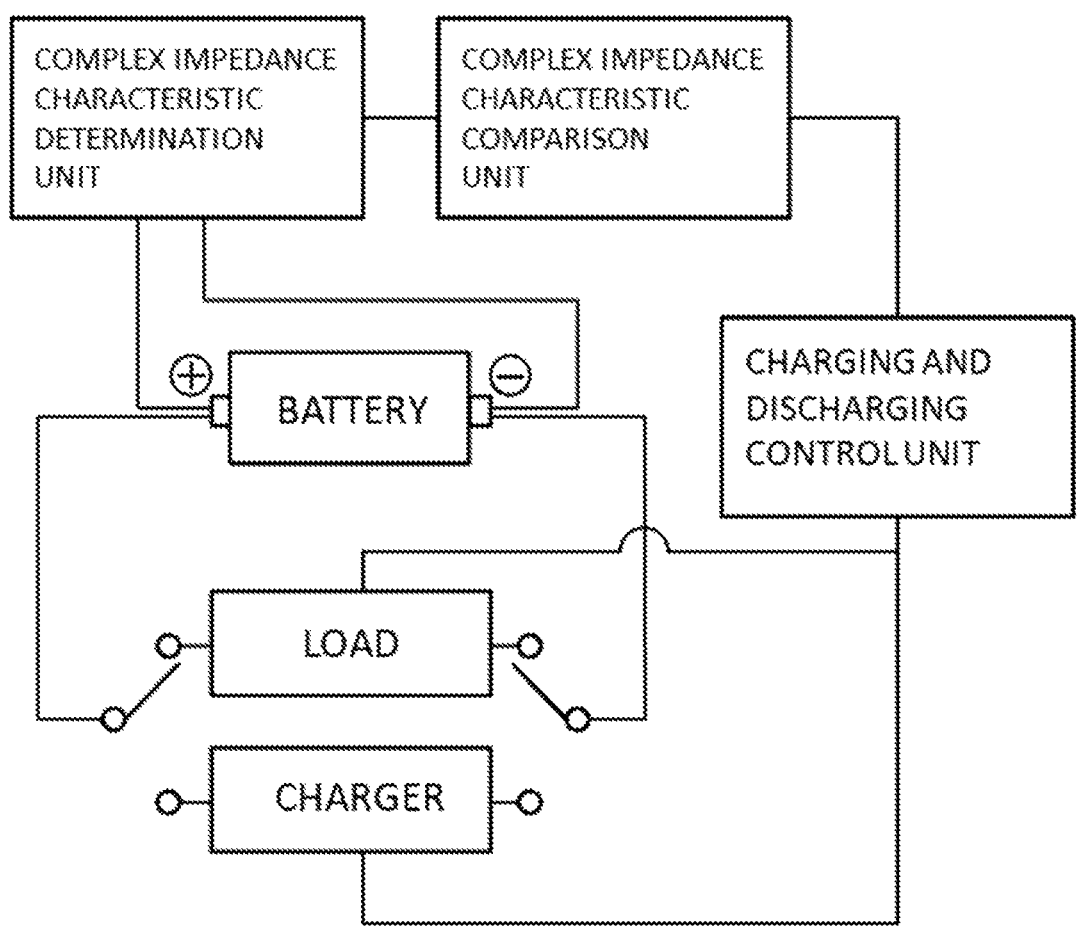
FIG. 2 is a schematic diagram of the configuration of a system configured to control charging and discharging operation based on a complex impedance characteristic of a battery.
Figure 7:
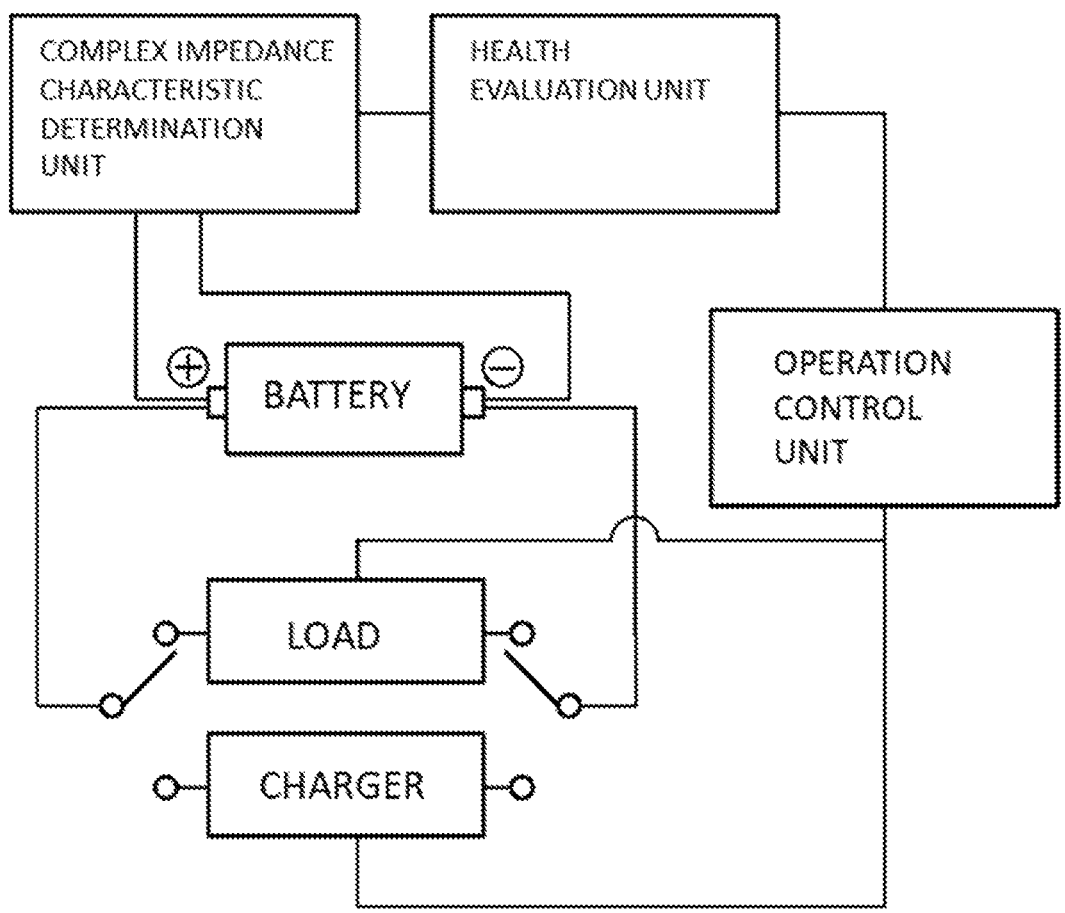
FIG. 7 is a schematic diagram of the configuration of a system configured to evaluate the health of a battery by using a complex impedance characteristic curve of the battery and control operation of the battery.

The system configurations illustrated in FIGS. 2 and 7 are merely exemplary. At least one arbitrary function performed for estimation of the state of charge or depth of discharge, health evaluation, and control based thereon taught by the present invention may be arbitrarily distributed to at least one arbitrary element.

Complex Impedance Determination

Figure 1:
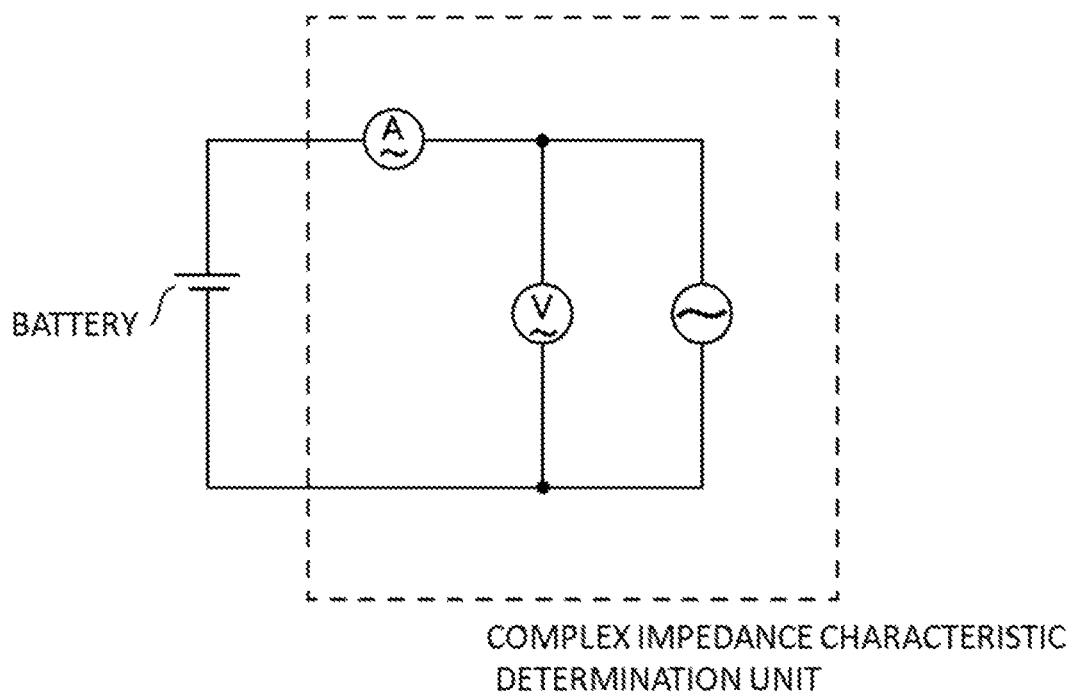
FIG. 1 is a circuit diagram schematically illustrating the circuit configuration of a complex impedance characteristic determination unit configured to determine the complex impedance of a battery (any element other than that directly related to measurement is omitted).

FIG. 1 schematically illustrates an exemplary circuit configuration of a complex impedance characteristic determination unit configured to determine the complex impedance of a secondary battery such as a lithium-ion secondary battery. While alternating-current current at a constant frequency is flowed from a variable-frequency alternating-current electric power source to the secondary battery (may be in charging and discharging operation. In this case, a charging source, a load, and the like connected with the secondary battery are not illustrated), alternating-current voltage applied to the secondary battery and alternating-current current flowing through the secondary battery are measured with an alternating-current voltmeter and an alternating-current ammeter. Then, the complex impedance is calculated from the measured voltage and current values. The frequency dependency of the complex impedance is determined through repetitive operation of calculating the complex impedance by measuring the alternating-current voltage and the alternating-current current in the similar manner while changing frequencies of the alternating-current current from the alternating-current electric power source.

The calculation of the complex impedance from the measured alternating-current voltage and alternating-current current values can be performed through, for example, calculation described below.

The alternating-current voltage applied to the secondary battery can be expressed in a complex number as follows:

[Numeral 1]

$$\tilde{V}(t) = \tilde{V}_0 e^{i\omega t} = V_0 e^{i\delta_V} e^{i\omega t} = V_0(\cos(\omega t + \delta_V) + i \sin(\omega t + \delta_V)) \quad (1)$$

($V_0$ is the amplitude of the alternating-current voltage, $\delta_V$ is an initial phase, $\omega$ (omega) is the angular frequency, t is time, and i is the imaginary unit). The alternating-current current flowing through the secondary battery can be expressed in a complex number as follows:

[Numeral 2]

$$\tilde{I}(t) = \tilde{I}_0 e^{i\omega t} = I_0 e^{i\delta_I} e^{i\omega t} = I_0(\cos(\omega t + \delta_I) + i \sin(\omega t + \delta_I)) \quad (2)$$

($I_0$ is the amplitude of the alternating-current current and $\delta_I$ is an initial phase).

The measured alternating-current voltage and alternating-current current correspond to the real parts of Expressions (1) and (2) above, which are $V_0 \cos(\omega(\text{omega})t+\delta_V)$ and $I_0 \cos(\omega(\text{omega})t+\delta_I)$, respectively. Their measured waveforms are used to determine $V_0$, $I_0$, $\omega$(omega), $\delta_V$, and $\delta_I$. The complex impedance at each angular frequency $\omega$(omega) is calculated as follows:

[Numeral 3]

$$\tilde{Z}(\omega) = \frac{\tilde{V}(t)}{\tilde{I}(t)} = \frac{V_0}{I_0} e^{i(\delta_V - \delta_I)} \quad (3)$$
$$= \frac{V_0}{I_0}(\cos(\delta_V - \delta_I) + i\sin(\delta_V - \delta_I))$$

Complex Impedance Characteristic Curve

From Expression (3) above, the real part Z' and imaginary part Z'' of the complex impedance can be expressed respectively as follows:

[Numeral 4]

$$Z' = \frac{V_0}{I_0}\cos(\delta_V - \delta_I) \quad (4)$$

[Numeral 5]

$$Z'' = -\frac{V_0}{I_0}\sin(\delta_V - \delta_I) \quad (5)$$

A complex impedance characteristic curve representing the correlation relationship between the real and imaginary parts of the complex impedance can be obtained by plotting the coordinate point (Z', Z") on a two-dimensional plane, calculating the complex impedance similarly for various (angular) frequencies and plotting the coordinate points (Z', Z").

Estimation of State of Charge or Depth of Discharge of Secondary Battery

The present inventors have found that the above-described complex impedance characteristic curve differs among different states of charge or depths of discharge, and in particular, the difference is significant in the frequency domain of Warburg impedance and a further lower frequency domain. Thus, when the complex impedance of an identical secondary battery in known states of charge or depths of discharge is measured in advance and a catalog of complex impedance characteristic curves (refer to FIGS. 3 and 4 to be described later) is produced, a complex impedance characteristic curve obtained by measuring the complex impedance of a secondary battery, the state of charge or depth of discharge of which is unknown, can be matched (checked) against the catalog in the frequency domain of Warburg impedance or the lower frequency domain to estimate this unknown state of charge or depth of discharge. Specifically, for example, the matching is performed by comparing a complex impedance characteristic curve obtained by measurement for a secondary battery, the state of charge or depth of discharge of which is unknown, with each complex impedance characteristic curve included in the catalog. Then, a complex impedance characteristic curve most "similar" to the complex impedance characteristic curve obtained by measurement (the similarity may be determined by an arbitrary method. For example, both curves may be determined to be "similar" as the square average of the difference between ordinate values of both curves at an identical abscissa value over all abscissa values is smaller. Alternatively, the determination may be performed by arbitrary image authentication) is extracted from the catalog. For example, the state of charge or depth of discharge corresponding to the extracted complex impedance characteristic curve is set as an estimated value of the unknown state of charge or depth of discharge (alternatively, for example, the estimated value may be a weighted average of the states of charge or depths of discharge corresponding to a plurality of complex impedance characteristic curves having high similarities. Any specific analysis method is arbitrarily applicable).

Estimation with Degradation State of Secondary Battery Taken into Account

Figure 3:
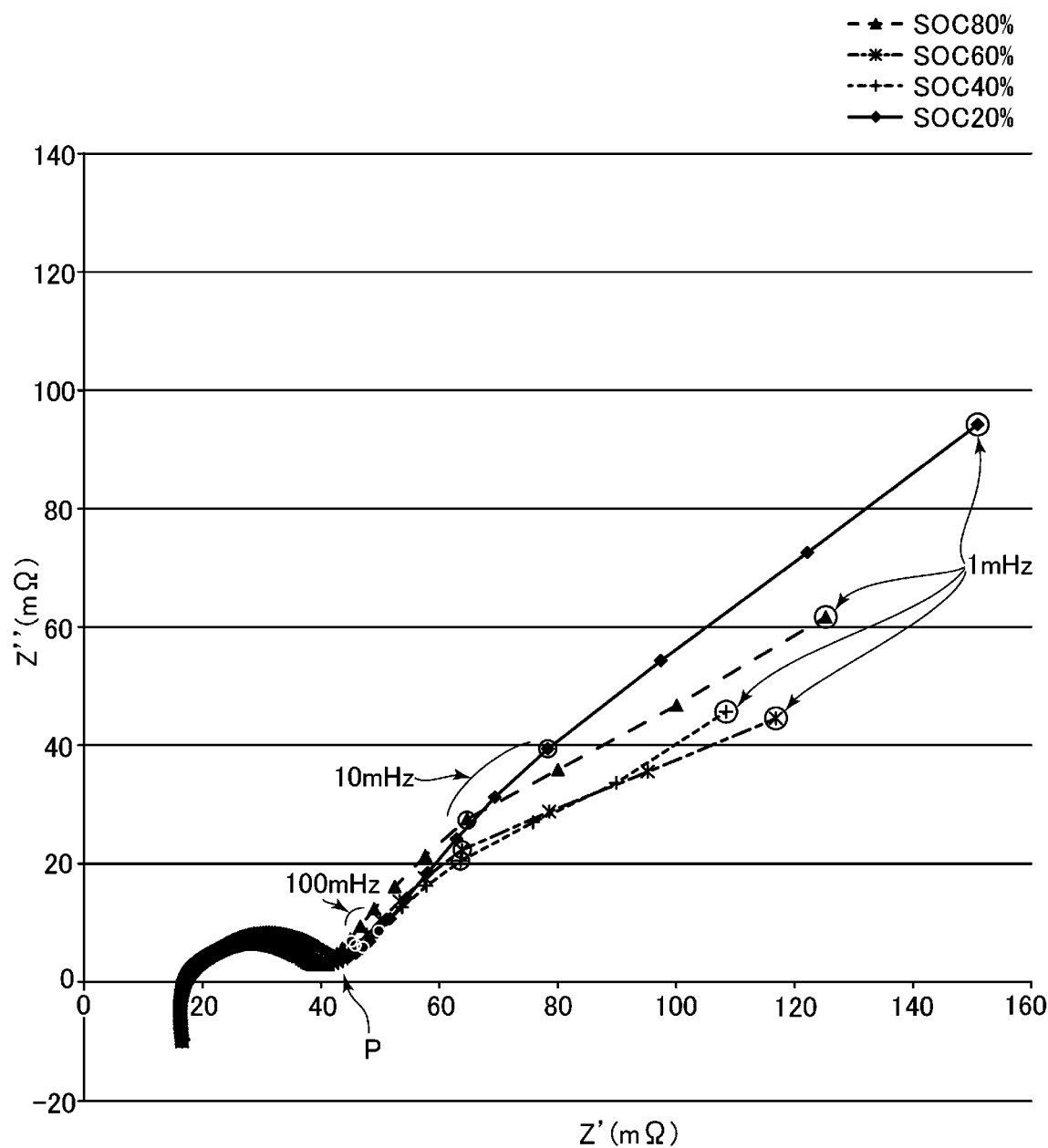
FIG. 3 is a graph illustrating, for each SOC, a complex impedance characteristic curve obtained by charging a lithium-ion secondary battery and measuring the complex impedance thereof while changing frequencies.
Figure 4:
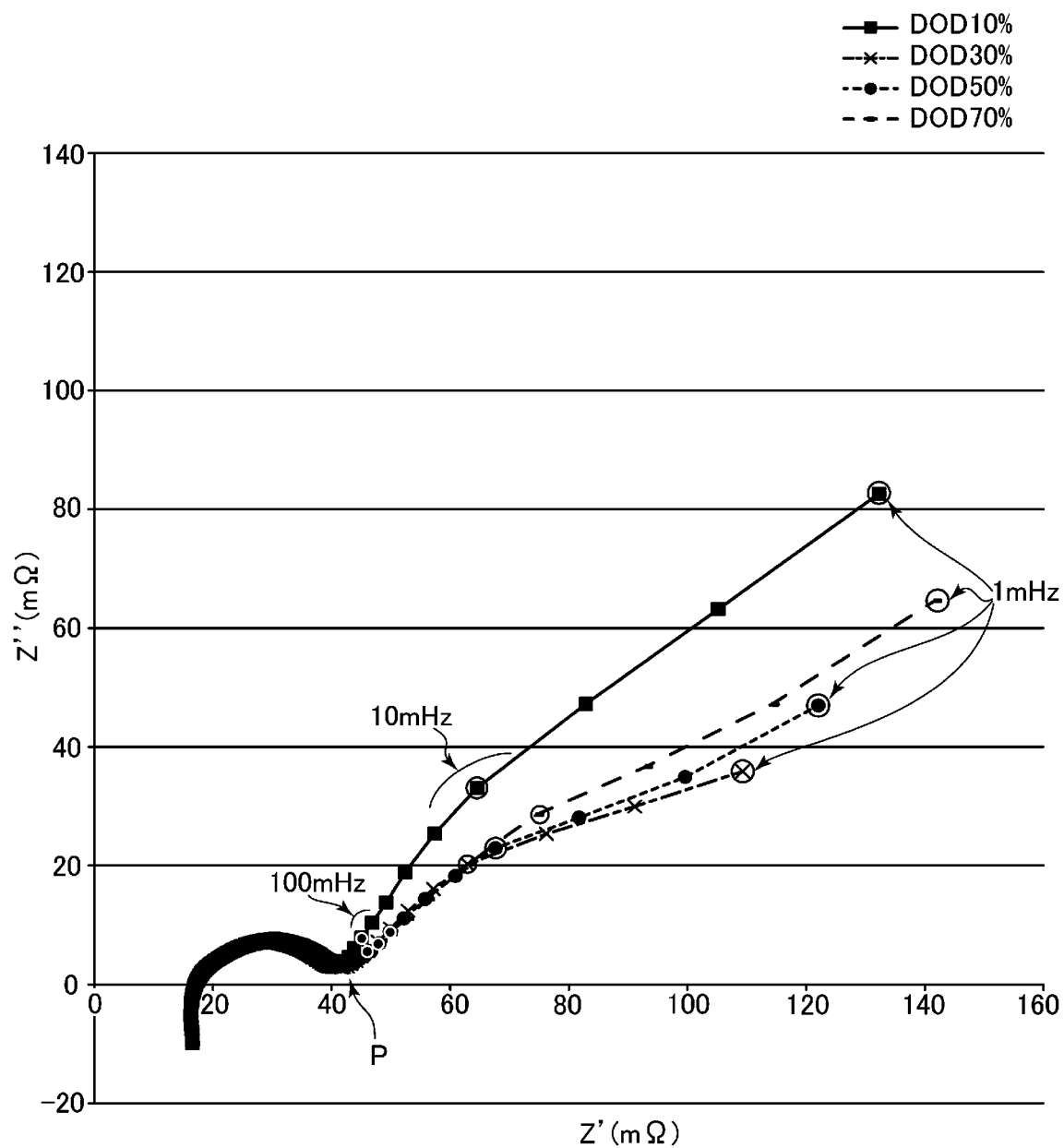
FIG. 4 is a graph illustrating, for each DOD, a complex impedance characteristic curve obtained by discharging the lithium-ion secondary battery and measuring the complex impedance thereof while changing frequencies.

As described above, since the frequency dependency (complex impedance characteristic curve) of the complex impedance can vary with the degradation state of the secondary battery, it is preferable to use, as the catalog, a catalog produced right before measurement of the complex impedance of a secondary battery, the state of charge or depth of discharge of which is unknown, as far as possible. Alternatively, when a catalog is produced in accordance with each degradation state of the secondary battery in advance, the accuracy of estimation of the state of charge or depth of discharge can be improved through catalog matching with the degradation state taken into account. Specifically, when producing a catalog, the direct-current resistance of the secondary battery is also measured and the direct-current resistance and the catalog like FIGS. 3 and 4 are stored as a set. A set of catalogs corresponding to various direct-current resistances can be obtained through repetitive operation of producing a catalog while measuring the direct-current resistance with degradation of the secondary battery through a long period of use. The accuracy of estimation of an unknown state of charge or depth of discharge of the secondary battery can be further improved by measuring the direct-current resistance of the secondary battery and performing matching by using a catalog corresponding to a direct-current resistance nearest to the measured direct-current resistance value.

Determination of Complex Impedance by Direct-Current Method

As described above, for example, the complex impedance can be directly measured through a measurement circuit configuration in an alternating-current scheme illustrated in FIG. 1, but the complex impedance can be also determined through analysis on a direct-current load. Specifically, while the secondary battery is used in connection with the load, a pulse is generated in current flowing to the secondary battery through superimposition of current in a constant pattern from an external circuit or abrupt cutoff of the connection with the load. In this case, a load on the secondary battery abruptly changes, and thus the voltage thereof temporally changes. Voltage and current waveforms as represented by Expressions (1) and (2) above can be obtained for each frequency by recording the temporally changing pulse-like current and the voltage temporally changing in response thereto as described above in the secondary battery and by disassembling the current and the voltage on frequencies by an analysis method such as Fourier series expansion, respectively. When the amplitudes and initial phases of the voltage and current are determined by analyzing the waveforms for each frequency, the complex impedance can be calculated for the each frequency, for example, by using Expressions (3) to (5) above. A complex impedance characteristic curve can be obtained by plotting the coordinate points (Z', Z") corresponding to the calculated complex impedance on a two-dimensional plane. The accuracy of estimation of the state of charge or depth of discharge can be further improved by measuring the direct-current resistance through, for example, long-period load variation to estimate the degradation state of the secondary battery and performing matching with a catalog corresponding to this degradation state (corresponding to a direct-current resistance nearest to the measured direct-current resistance).

Charging and Discharging Control Based on Estimated State of Charge or Depth of Discharge When charging and discharging of a secondary battery is controlled based on the state of charge or depth of discharge estimated as described above, the secondary battery can be safely used while overcharging and overdischarging are prevented. FIG. 2 illustrates a schematic diagram of the configuration of an exemplary system for estimating the state of charge or depth of discharge of a secondary battery such as a lithium-ion secondary battery and feeding back the estimated value to control charging and discharging. No charger is needed when a system for a primary battery is configured in a similar manner.

The secondary battery is connected with a load (such as an arbitrary instrument that consumes electric power) or a charger (arbitrary charging external electric power source such as a solar battery system) by switching (a switching control circuit or the like is not illustrated) to perform an on-board discharging or charging operation.

The secondary battery is connected with the complex impedance characteristic determination unit, for example, in a connection manner illustrated in FIG. 1. As illustrated in FIG. 1, the complex impedance characteristic determination unit has the functionalities of an alternating-current electric power source, an alternating-current voltmeter, and an alternating-current ammeter. The complex impedance characteristic determination unit includes, for example, a processor configured to perform various kinds of data processing such as the above-described calculation of complex impedance from measured alternating-current current and alternating-current voltage values, a memory configured to store data, a control circuit configured to control functions described below, and a communication circuit configured to communicate with other circuit units (similarly, a complex impedance characteristic comparison unit and a charging and discharging control unit each include a processor, a memory, a control/communication circuit, and the like. Description thereof will be omitted in the following). The complex impedance characteristic determination unit measures the complex impedance of the lithium-ion secondary battery while changing frequencies as described above. As described above, the complex impedance characteristic can be determined by the direct-current method. The complex impedance characteristic determination unit may be configured using a processing circuit or the like consisted of, for example, a control circuit configured to, for example, cut off connection with a load as described above, a processor configured to perform Fourier analysis, and a memory. When the estimation is performed with the degradation state taken into account, the direct-current resistance is measured by, for example, measuring the complex impedance with long-period alternating-current current flowing from the alternating-current electric power source.

The measurement result of the complex impedance, and a signal representing the measured direct-current resistance value when needed, are transmitted from the complex impedance characteristic determination unit to the complex impedance characteristic comparison unit. As described above, the complex impedance characteristic comparison unit stores, in the memory thereof, a catalog (in a graph format as illustrated in FIGS. 3 and 4 to be described later in this example, but may be in a data format in which a complex impedance value is recorded for each frequency) produced from a result of measuring, in advance, the frequency dependency of complex impedance corresponding to a known state of charge or depth of discharge of the secondary battery. The complex impedance characteristic comparison unit produces a complex impedance characteristic curve from the measured values of the current complex impedance of the secondary battery, which values are received from the complex impedance characteristic determination unit. The produced complex impedance characteristic curve is compared with each complex impedance characteristic curve corresponding to various kinds of states of charge or depths of discharge included in the catalog (when the estimation with the degradation state taken into account is performed, the degradation state is estimated from the direct-current resistance value received from the complex impedance characteristic determination unit (for example, direct-current resistance value data of secondary batteries having various cumulative use durations is stored in advance, and the degradation state is estimated based on a cumulative use duration corresponding to direct-current resistance value data nearest to the direct-current resistance value data received from the complex impedance characteristic determination unit), and a catalog corresponding to a direct-current resistance value nearest to the received direct-current resistance value is used) to estimate the current state of charge or depth of discharge of the secondary battery (a complex impedance characteristic curve produced from measured values of the complex impedance is compared with a catalog produced for each depth of discharge as illustrated in FIG. 4 when the secondary battery is connected with a load, that is, in discharging; or a complex impedance characteristic curve produced from measured values of the complex impedance is compared with a catalog produced for each state of charge as illustrated in FIG. 3 when the secondary battery is connected with a charger, that is, in charging. Whether the secondary battery is connected with the load or the charger is notified, for example, by a signal transmitted to the complex impedance characteristic comparison unit from a switching control circuit capable of switching the connection). It is effective to perform the above-described comparison of the frequency characteristic of complex impedance by using a catalog in the frequency domain of Warburg impedance or the lower frequency domain as described above. For example, it is effective to perform the comparison in a frequency domain equal to or lower than approximately 100 mHz, preferably equal to or lower than approximately 10 mHz. Alternatively, the comparison may be performed on a lower frequency side than a frequency at which change of the imaginary part makes transition from decrease to increase along with increase of the real part on a complex impedance characteristic curve.

A signal representing a result of estimation of the state of charge or depth of discharge is transmitted from the complex impedance characteristic comparison unit to the charging and discharging control unit. The charging and discharging control unit controls discharging at the load or charging by the charger based on this estimation result. For example, when the depth of discharge exceeds a predetermined reference value during discharging at the load, electric power consumption at the load is controlled by, for example, cutting off the connection between the secondary battery and the load or reducing electric power consumption at the load with a control signal (For example, electric power consumption is reduced when the load includes an inverter. When the load includes a plurality of electric power consuming elements, electric power supply to some elements is cut off, for example.) (the similar manner is applied to a case in which a primary battery is used). When the state of charge exceeds a predetermined reference value during charging by the charger, charging by the charger is controlled by cutting off the connection between the secondary battery and the charger to prevent overcharging, for example.

In this manner, the complex impedance of a battery is measured to estimate the state of charge or depth of discharge, and a result of the estimation is fed back to control charging and discharging, thereby enabling to lead the state of charge or depth of discharge to an appropriate value.

In this case, a complex impedance characteristic curve is produced by the complex impedance characteristic comparison unit, but this processing may be performed at the complex impedance characteristic determination unit. Any other data processing, data storage, and the like may be performed by any circuit unit capable of performing feedback control similar to the above-described feedback control. Each circuit unit may include a plurality of circuit units or may be a single integrated device. Alternatively, a plurality of circuit units such as the complex impedance characteristic determination unit and the complex impedance characteristic comparison unit may be integrated as a single device.

Embodiment 1

A complex impedance characteristic curve was produced by measuring, while changing frequencies, the complex impedance of a commercially available winding-type lithium-ion secondary battery made using, as a positive electrode material, olivine-type lithium iron phosphate (LiFePO$_4$), using, as a negative electrode material, graphite carbon, and using organic electrolytic solution and a polyethylene separator. Impedance measurement was performed by using ELECTROCHEMICAL ANALYZER As-510-ECA and SARVO ANALYZER FRA5014, which are manufactured by NF Corporation.

In an experiment, first, the complex impedance of the lithium-ion secondary battery was measured while changing frequencies while the lithium-ion secondary battery is in the state of charge of 50%. Then, the lithium-ion secondary battery was charged to the state of charge of 90%. Thereafter, the lithium-ion secondary battery was discharged by 10%, and the complex impedance was measured while changing frequencies for each depth of discharge. This process was repeated until the depth of discharge reached at 80% (FIG. 4). Subsequently after a rest, while the lithium-ion secondary battery was charged to the state of charge of 90% in steps of 10% again, the complex impedance was measured while changing frequencies for each state of charge (FIG. 3). Lastly, the depth of discharge was returned to 50% and the impedance was measured again.

FIG. 3 illustrates a graph of results of measuring the complex impedance for the states of charge of 20%, 40%, 60%, and 80%, and FIG. 4 illustrates a graph of results of measuring the complex impedance for the depths of discharge of 10%, 30%, 50%, and 70% (the abscissa axis represents the real part and the ordinate axis represents the imaginary part in units of mΩ (milli ohm)). In each graph, the left side corresponds to the higher frequency side, and the right side corresponds to the lower frequency side. As illustrated in the graphs, when the real part of the complex impedance substantially exceeds 40 mΩ (milli ohm), the complex impedance characteristic curve starts separating among the states of charge or depths of discharge. The complex impedance characteristic curve exhibits a semicircular graph until the real part increases to approximately 40 mΩ (milli ohm), and thereafter exhibits a monotonically increasing graph in the frequency domain of Warburg impedance (substantially equal to or lower than 100 mHz). The separation of the complex impedance characteristic curve among the different states of charge or depths of discharge is significant at this monotonically increasing part. The separation of the complex impedance characteristic curve is further significant in regions such as 10 mHz and 1 mHz, which are lower than the frequency domain of Warburg impedance (as illustrated in FIGS. 3 and 4, the complex impedance characteristic curve has a different gradient in a frequency domain equal to or lower than approximately 10 mHz). The shape of each graph indicates that the complex impedance characteristic curve is significantly separated among the states of charge or depths of discharge on a lower frequency side than a frequency at which change of the imaginary part makes transition from decrease to increase along with increase of the real part on the complex impedance characteristic curve.

Data for typical frequencies among data of the real and imaginary parts of complex impedance obtained by the measurement is listed in Table 1 (data of the real part of complex impedance measured while changing frequencies for each state of charge; corresponding to FIG. 3), Table 2 (data of the imaginary part of the complex impedance measured while changing frequencies for each state of charge; corresponding to FIG. 3), Table 3 (data of the real part of complex impedance measured while changing frequencies for each depth of discharge; corresponding to FIG. 4), and Table 4 (data of the imaginary part of the complex impedance measured while changing frequencies for each depth of discharge; corresponding to FIG. 4) below (the real and imaginary parts of the complex impedance are all in units of mΩ (milli ohm)).

TABLE 1

|  | 1000 Hz | 100 Hz | 10 Hz | 1 Hz | 100 mHz | 10 mHz | 1 mHz |
|---|---|---|---|---|---|---|---|
| SOC90% | 18.5 | 26.0 | 35.6 | 39.5 | 44.1 | 63.5 | 132 |
| SOC80% | 18.5 | 26.0 | 36.2 | 40.3 | 45.0 | 64.7 | 125 |
| SOC70% | 18.6 | 26.1 | 36.7 | 40.9 | 45.5 | 64.1 | 118 |
| SOC60% | 18.5 | 26.2 | 36.9 | 41.2 | 45.7 | 63.8 | 117 |
| SOC50% | 18.6 | 26.2 | 37.2 | 41.6 | 46.1 | 62.4 | 104 |
| SOC40% | 18.6 | 26.3 | 37.7 | 42.1 | 47.0 | 63.6 | 108 |
| SOC30% | 18.6 | 26.3 | 38.2 | 42.9 | 47.8 | 64.8 | 111 |
| SOC20% | 18.6 | 26.4 | 39.5 | 44.8 | 51.7 | 78.4 | 151 |

TABLE 2

|  | 1000 Hz | 100 Hz | 10 Hz | 1 Hz | 100 mHz | 10 mHz | 1 mHz |
|---|---|---|---|---|---|---|---|
| SOC90% | 2.33 | 6.12 | 4.03 | 2.87 | 7.17 | 30.4 | 74.8 |
| SOC80% | 2.35 | 6.28 | 4.26 | 3.03 | 7.24 | 27.5 | 61.7 |
| SOC70% | 2.36 | 6.44 | 4.47 | 3.01 | 6.76 | 24.0 | 47.1 |
| SOC60% | 2.39 | 6.55 | 4.56 | 2.96 | 6.24 | 22.3 | 44.5 |
| SOC50% | 2.41 | 6.70 | 4.66 | 2.99 | 6.34 | 20.7 | 39.4 |
| SOC40% | 2.42 | 6.90 | 4.88 | 3.08 | 5.90 | 20.4 | 45.7 |
| SOC30% | 2.41 | 7.08 | 5.21 | 3.29 | 6.48 | 22.5 | 60.1 |
| SOC20% | 2.41 | 7.61 | 6.01 | 4.32 | 10.7 | 39.4 | 94.2 |

TABLE 3

|  | 1000 Hz | 100 Hz | 10 Hz | 1 Hz | 100 mHz | 10 mHz | 1 mHz |
|---|---|---|---|---|---|---|---|
| DOD10% | 18.6 | 26.4 | 36.8 | 40.7 | 45.1 | 64.5 | 132 |
| DOD20% | 18.6 | 26.5 | 37.4 | 41.5 | 45.4 | 60.5 | 102 |
| DOD30% | 18.7 | 26.6 | 37.9 | 42.0 | 46.2 | 62.9 | 109 |
| DOD40% | 18.7 | 26.6 | 38.2 | 42.6 | 47.2 | 64.3 | 110 |
| DOD50% | 18.6 | 26.6 | 38.5 | 43.0 | 48.1 | 67.6 | 122 |
| DOD60% | 18.6 | 26.5 | 38.5 | 43.4 | 49.2 | 69.5 | 121 |
| DOD70% | 18.5 | 26.3 | 38.4 | 43.5 | 49.9 | 74.6 | 142 |
| DOD80% | 18.5 | 26.1 | 38.3 | 43.7 | 51.0 | 79.2 | 156 |

TABLE 4

|  | 1000 Hz | 100 Hz | 10 Hz | 1 Hz | 100 mHz | 10 mHz | 1 mHz |
|---|---|---|---|---|---|---|---|
| DOD10% | 2.48 | 6.73 | 4.49 | 3.08 | 7.87 | 33.1 | 82.6 |
| DOD20% | 2.50 | 6.82 | 4.65 | 2.74 | 5.66 | 19.6 | 38.8 |
| DOD30% | 2.49 | 7.01 | 4.84 | 2.87 | 5.58 | 20.2 | 35.9 |
| DOD40% | 2.54 | 7.11 | 5.01 | 3.08 | 6.30 | 22.2 | 43.3 |
| DOD50% | 2.50 | 7.18 | 5.17 | 3.31 | 6.93 | 22.9 | 47.0 |
| DOD60% | 2.45 | 7.16 | 5.30 | 3.63 | 7.82 | 25.4 | 58.8 |
| DOD70% | 2.37 | 7.08 | 5.36 | 3.93 | 8.94 | 28.6 | 64.6 |
| DOD80% | 2.22 | 7.06 | 5.52 | 4.22 | 10.6 | 33.9 | 73.8 |

As understood from Tables 1 to 4, the values of the real and imaginary parts of the complex impedance in a high frequency domain of approximately 1000 Hz to 100 Hz do not largely differ between different states of charge or depths of discharge, but the values of the imaginary part start largely differing between the states of charge or depths of discharge at frequencies approximately at 1 Hz to 100 mHz (as understood from Tables 1 and 3, frequencies at which the real part of the complex impedance substantially exceeds 40 mΩ (milli ohm)). In particular, the difference is significant at frequencies equal to or lower than 10 mHz. Thus, it is expected that the state of charge or depth of discharge can be estimated at a high accuracy by comparing complex impedance characteristics substantially in a frequency domain equal to or lower than 100 mHz, preferably equal to or lower than 10 mHz. An unknown state of charge or depth of discharge can be determined through matching with catalogs in graph formats as illustrated in FIGS. 3 and 4 or data formats as illustrated in Tables 1 to 4. In addition, when these catalogs are recorded in association with a direct-current resistance value (corresponding to the degradation state of the secondary battery) at the time of measurement of the complex impedance, an unknown state of charge or depth of discharge of the secondary battery can be estimated at a higher accuracy by measuring the direct-current resistance of the secondary battery and performing matching with a catalog corresponding to a direct-current resistance value nearest to the measured value.

Figure 5:
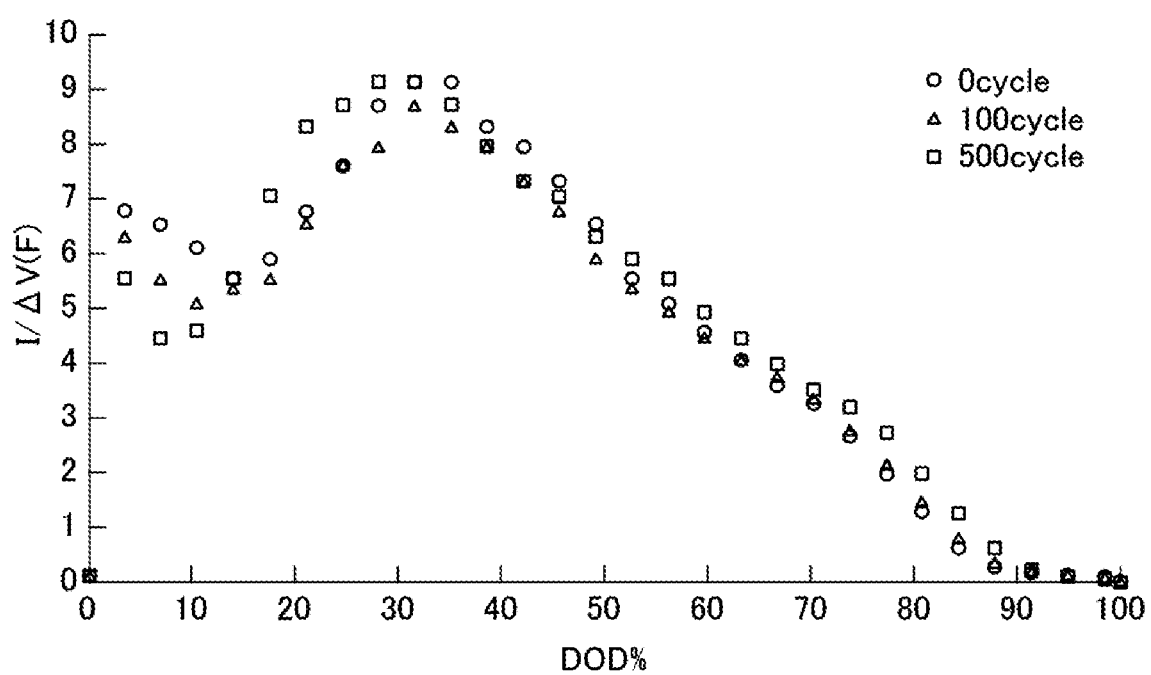
FIG. 5 is a graph when the differential capacity of the lithium-ion secondary battery in discharging is measured, the graph representing a relation between the DOD and the differential capacity.

Estimation of State of Charge or Depth of Discharge Based on Differential Capacity The state of charge or depth of discharge of a battery can be estimated by using, for example, the dependency of differential capacity on the state of charge or depth of discharge in addition to the above-described frequency dependency of complex impedance. FIG. 5 illustrates a graph when the differential capacity of a lithium-ion secondary battery in discharging is measured. The graph represents a relation between the depth of discharge (DOD) and the differential capacity (ratio I/Δ (delta) V of the amount of change in electric charge Q (illustrated as current I in the graph) to the amount of change in voltage Δ (delta) V; in units of farad (F)). However, a differential capacity characteristic typically changes with, for example, degradation of the battery, and thus differential capacity characteristic for different numbers of charging and discharging cycles (0 cycles, 100 cycles, and 500 cycles) are plotted as a graph, respectively. The battery used in the experiment was a commercially available winding-type lithium-ion secondary battery made using, as a positive electrode material, olivine type lithium iron phosphate (LiFePO$_4$), using as a negative electrode material, graphite carbon, and using organic electrolytic solution and a polyethylene separator.

Since the differential capacity of a battery typically depends on the state of charge or depth of discharge, the state of charge or depth of discharge can be estimated from a measured value of the differential capacity. Thus, even if it is difficult to estimate the state of charge or depth of discharge only from the frequency dependency of complex impedance, the value of the differential capacity can be used to accurately estimate the state of charge or depth of discharge in some cases. For example, when the gradient of a battery discharging curve of electric potential variation along with capacity change described above is similar for two different states of charge or depths of discharge, it is difficult to distinguish the two different states of charge or depths of discharge only from the frequency dependency of complex impedance in some cases. In such a case, one of the two different states of charge or depths of discharge, which is closer to the state of charge or depth of discharge estimated from a measured value of the differential capacity, can be used as an estimated value.

When the above-described estimation of the state of charge or depth of discharge by using the differential capacity is performed in the system illustrated in FIG. 2, the differential capacity can be measured with measurement instruments such as the voltmeter and the ammeter in the complex impedance characteristic determination unit (hereinafter, functioning as a differential capacity determination unit). For example, measurement results obtained by measuring differential capacity values for various depths of discharge or states of charge as illustrated in FIG. 5 in advance are stored as a catalog of differential capacities in the memory of the complex impedance characteristic comparison unit (hereinafter, functioning as a differential capacity comparison unit). The state of charge or depth of discharge of the battery can be estimated by matching a measured value of the differential capacity with this catalog (for example, a point is specified in a catalog including a differential capacity value nearest to the measured value of the differential capacity, and the value of the state of charge or depth of discharge at the point is used as an estimated value). Preferably, measurement results obtained by measuring differential capacity values for various depths of discharge or states of charge in advance are produced as a differential capacity catalog for each degradation state estimated from the direct-current resistance value of the battery. Specifically, the direct-current resistance of the battery is measured at production of a differential capacity catalog and stored as a set in association with differential capacity catalogs as in the graph illustrated in FIG. 5 (FIG. 5 includes three catalogs for different degradation states). A set of catalogs of differential capacities corresponding to various direct-current resistances can be obtained through repetitive operation of producing a differential capacity catalog by measuring the direct-current resistance after degradation of the battery through a long period of use. An unknown state of charge or depth of discharge of a secondary battery can be estimated from the differential capacity at a further improved accuracy by measuring the direct-current resistance of the battery and performing matching with a differential capacity catalog corresponding to a direct-current resistance nearest to the measured direct-current resistance value.

When the state of charge or depth of discharge is estimated by the system illustrated in FIG. 2, the complex impedance characteristic determination unit measures the current differential capacity value of a battery and transmits a result of the measurement to the complex impedance characteristic comparison unit. The complex impedance characteristic comparison unit estimates the current state of charge or depth of discharge of the battery by comparing the received current differential capacity measured value with a differential capacity value corresponding to various kinds of states of charge or depths of discharge included in a differential capacity catalog stored in the memory of the complex impedance characteristic comparison unit. When the estimation with the degradation state taken into account is performed, a degradation state is estimated from a measured direct-current resistance value received from the complex impedance characteristic determination unit (for example, direct-current resistance value data of batteries having various cumulative use durations is stored in advance, and the degradation state is estimated based on a cumulative use duration corresponding to direct-current resistance value data nearest to the direct-current resistance value data received from the complex impedance characteristic determination unit), and a differential capacity catalog corresponding to a direct-current resistance value nearest to the received direct-current resistance value is used. As described above with reference to FIG. 2, the current differential capacity value is compared with: differential capacity catalogs produced for depths of discharge as illustrated in FIG. 5 when the battery is connected with a load, that is, in discharging; or differential capacity catalogs similarly produced for states of charge when the battery is connected with a charger, that is, in charging.

In this manner, the complex impedance characteristic comparison unit can estimate the state of charge or depth of discharge also from a measured value of the differential capacity. The state of charge or depth of discharge can be more accurately estimated by comparing the state of charge or depth of discharge estimated based on the frequency dependency of complex impedance as described above with the state of charge or depth of discharge estimated in that manner from a measured value of differential capacity. The estimation of the state of charge or depth of discharge from the measured value of differential capacity does not need to be combined with the estimation of the state of charge or depth of discharge based on the frequency dependency of complex impedance, but may be performed alone. In other words, the state of charge or depth of discharge can be estimated only from dependency on differential capacity. In the graph illustrated in FIG. 5, the peak of differential capacity appearing substantially near the DOD of 30% to 40% varies with the degradation state (the number of cycles) of the battery, and it is expected that the degree of degradation can be diagnosed through management of the variance of the differential capacity peak.

Battery Health Evaluation Based on Complex Impedance Characteristic

Figure 6A:
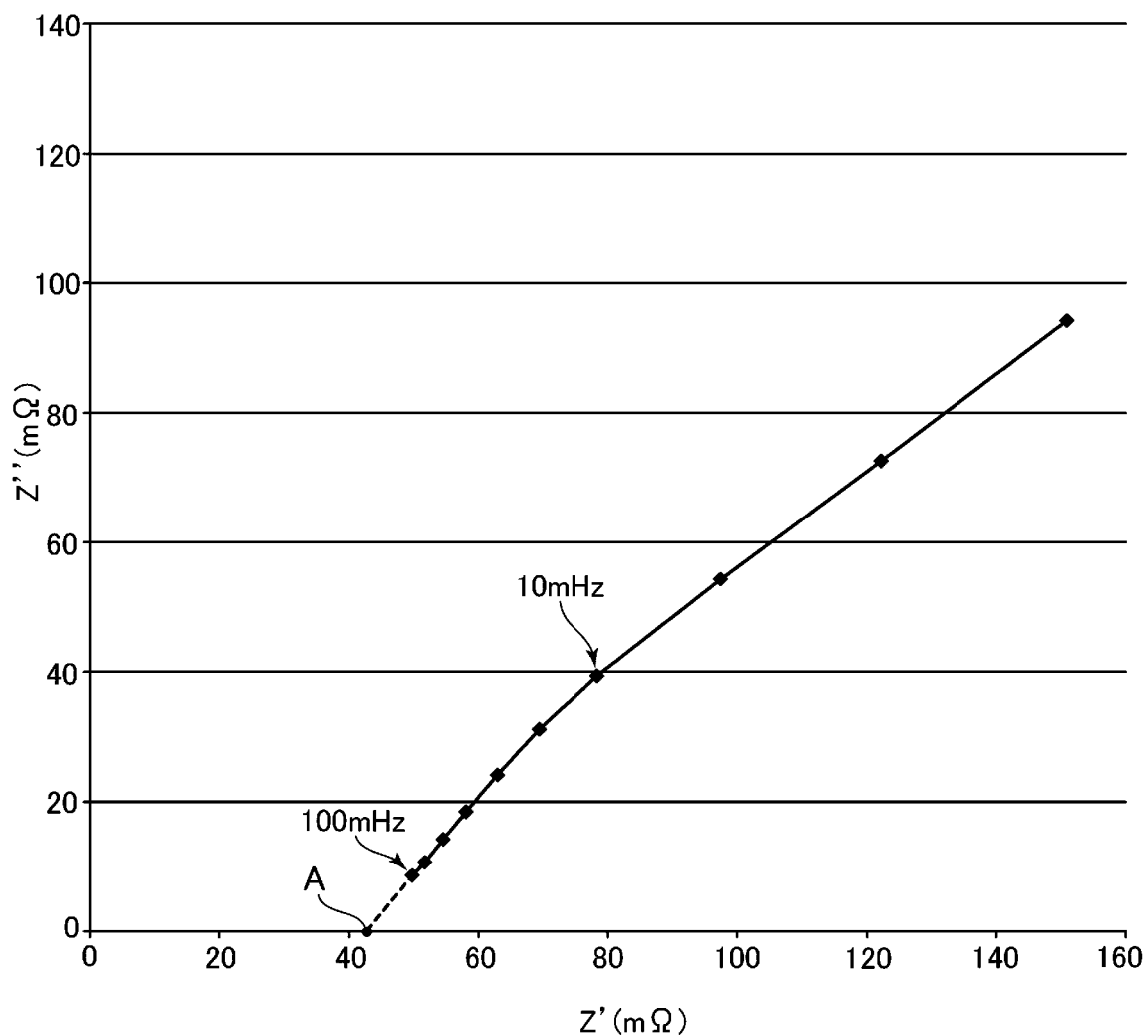
FIG. 6a is a graph indicating an intersection point, with the abscissa axis, of a line extending from a part of a complex impedance characteristic curve for the SOC of 20% in the graph illustrated in FIG. 3, which corresponds to a frequency equal to or lower than approximately 100 mHz.

The health of a battery can also be evaluated by using a complex impedance characteristic curve exemplarily illustrated in FIGS. 3 and 4. FIG. 6a is a graph indicating an intersection point, with the abscissa axis, of a line extending from a part, which corresponds to a frequency equal to or lower than approximately 100 mHz (corresponds to the frequency domain of Warburg impedance, and focusing on the shape of the graph, corresponds to a lower frequency side than a frequency at which change of the imaginary part along with increase of the real part on the complex impedance characteristic curve makes transition from decrease to increase), of the complex impedance characteristic curve for the SOC of 20% in the graph illustrated in FIG. 3, illustrating the principle of health evaluation.

It is thought that the real part of the complex impedance at a point where the imaginary part of the complex impedance is zero (intersection point A with the abscissa axis) on the above-described extended part corresponds to the total internal resistance of the battery as described above. Thus, when the point A is positioned further on the left side (on which the real part of the complex impedance is smaller) than in the past in a secondary battery repeatedly charged and discharged through a large number of cycles or a primary battery, the health of which is degraded for some reason, it is estimated that the internal resistance is reduced due to some factor inside of the battery. The decrease of the internal resistance is caused by, as a contributor, short circuit inside of the battery. In other words, the decrease of the real part of the complex impedance at the point A can be regarded as a sign of short circuit inside of the battery. When the battery is kept operated in such degraded health, serious accidents such as firing and explosion of the battery due to short circuit potentially occur. Thus, when the decrease of the real part is detected, it is preferable to determine that the health of the battery has degraded and then perform control to, for example, immediately stop or drastically restrict the operation of the battery.

Figure 6B:
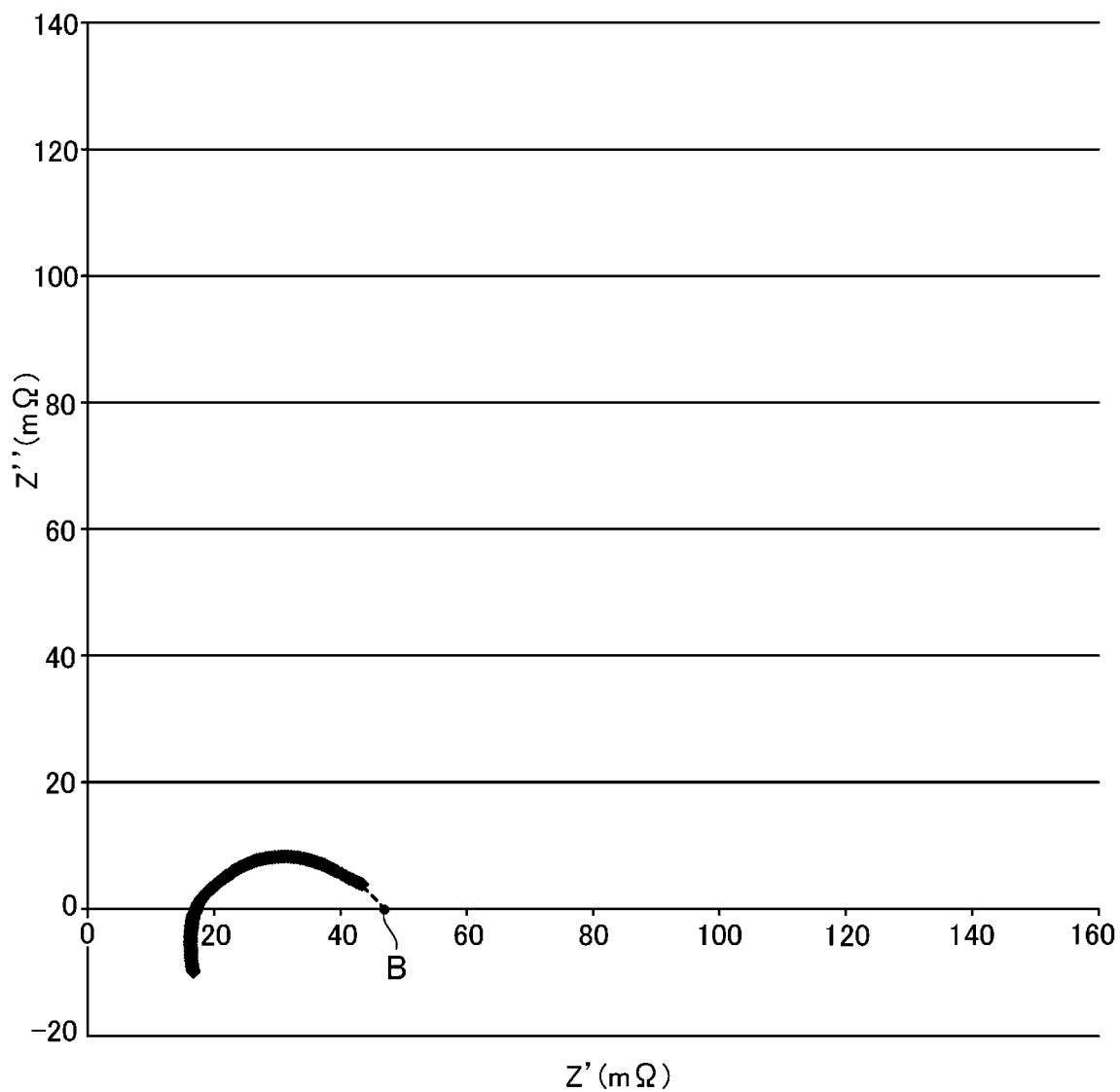
FIG. 6b is a graph indicating an intersection point, with the abscissa axis, of a line extending from part of the complex impedance characteristic curve for the SOC of 20% in the graph illustrated in FIG. 3 on a higher frequency side than a frequency at which change of the imaginary part along with increase of the real part makes transition from decrease to increase.

FIG. 6b illustrates another principle for evaluating the health of a battery by using a complex impedance characteristic curve. FIG. 6b indicates an intersection point, with the abscissa axis, of a line extending from a part of the complex impedance characteristic curve for the SOC of 20% in the graph illustrated in FIG. 3 on a higher frequency side than a frequency at which change of the imaginary part along with increase of the real part makes transition from decrease to increase. Similarly to the real part at the point A, it is thought that the real part of the complex impedance at a point (intersection point B with the abscissa axis) where the imaginary part is zero on a line obtained by performing fitting of a semi arc-like part of the complex impedance characteristic curve and extending it decreases due to, for example, short circuit inside of the battery. In other words, also the decrease of the real part of the complex impedance at the point B can be regarded as a sign of short circuit inside of the battery. In a possible exemplary method using fitting, a resistance component inside of the battery is obtained by establishing an equivalent circuit simulating inside of the battery for determined complex impedance and by performing calculation through fitting of impedance information using the equivalent circuit, and the resistance component can be used for health evaluation, similarly to the real part at the point B.

FIG. 7 illustrates a schematic diagram of the configuration of a system for such health evaluation and operation control of a battery. Similarly to FIG. 2, the illustrated system is a system for a secondary battery, and thus no charger is needed in the configuration of a system for a primary battery if configured similarly. Description of any component similar to that in the system illustrated in FIG. 2 is omitted as appropriate.

Similarly to the system in FIG. 2, the secondary battery is connected with a load or a charger by switching to perform on-board discharging or charging operation. Similarly to the system in FIG. 2, the complex impedance characteristic determination unit is connected with the secondary battery to measure the complex impedance of the secondary battery while changing frequencies as described above. The complex impedance characteristic may be determined by the direct-current method as described above with reference to FIG. 2, and the complex impedance characteristic determination unit has a specific configuration as described above with reference to FIG. 2.

A measurement result of the complex impedance is transmitted from the complex impedance characteristic determination unit to a health evaluation unit (including, for example, a processor, a memory, and a control/communication circuit as appropriate, similarly to the complex impedance characteristic comparison unit illustrated in FIG. 2; description thereof will be omitted in the following).

When based on the principle described with reference to FIG. 6a, the health evaluation unit produces a complex impedance characteristic curve from a measured value of the current complex impedance of the secondary battery, which is received from the complex impedance characteristic determination unit, and determines the real part of the complex impedance at the point A (refer to FIG. 6a) where the imaginary part of the complex impedance is zero on a line obtained by extending a part, which corresponds to the frequency domain of Warburg impedance, of the complex impedance characteristic curve (for example, part representing the frequency dependency of the complex impedance at a frequency equal to or lower than approximately 100 mHz, or part on a lower frequency side than a frequency at which change of the imaginary part along with increase of the real part of the complex impedance makes transition from decrease to increase). The memory of the health evaluation unit stores the real part of complex impedance determined for the secondary battery by the similar method in the past. The health evaluation unit evaluates the health of the secondary battery by comparing, on the complex impedance characteristic curve obtained from the measured values of the current complex impedance, the real part determined as described above with the real part determined for the secondary battery in the past as described above.

When based on the principle described with reference to FIG. 6b, the health evaluation unit produces a complex impedance characteristic curve from measured values of the current complex impedance of the secondary battery, which are received from the complex impedance characteristic determination unit, and determines the real part of the complex impedance at the point B (refer to FIG. 6b) where the imaginary part of the complex impedance is zero on a line obtained by extending a part of the complex impedance characteristic curve on a higher frequency side than a frequency at which change of the imaginary part along with increase of the real part makes transition from decrease to increase. The memory of the health evaluation unit stores the real part of complex impedance determined for the secondary battery by the similar method in the past. The health evaluation unit evaluates the health of the secondary battery by comparing the real part determined as described above on the complex impedance characteristic curve obtained from the measured values of the current complex impedance with the real part determined for the secondary battery in the past as described above. Examples of a method using fitting include the method using an equivalent circuit as described above in which a resistance component calculated through fitting using the equivalent circuit may be used for health evaluation. In this case, a resistance component determined by the similar method in the past is stored in the memory of the health evaluation unit, and the resistance components in the past is compared with the current resistance component to evaluate the health of the secondary battery. Similarly to the real part of the complex impedance at the point B, the resistance component calculated by fitting using an equivalent circuit can be used in the following. Thus description thereof will be omitted in the following as appropriate.

It is thought that the position of the point A or B (or the resistance component calculated by fitting using the above-described equivalent circuit) can typically vary also with the SOC or DOD of the secondary battery. Thus, the comparison between the real part (or the resistance component) of the complex impedance at the current point A or B and a real part (or the resistance component) determined in the past is preferably comparison between real parts (or the resistance components) for the same SOC or DOD. In this case, the memory of the health evaluation unit stores, as a catalog, a set of each various SOC or DOD value (determined in advance by an arbitrary method including the estimation method according to the present invention or a conventional method) of the secondary battery and the real part (or the resistance component) (determined in advance by using, for example, the system in FIG. 7) of the complex impedance at the point A or B in the past for the SOC or DOD. To evaluate the (current) health of the secondary battery, the health evaluation unit evaluates the health of the secondary battery by comparing the real part (or the resistance component) of the complex impedance at the point A or B in the past in the catalog corresponding to an SOC or DOD equal or nearest to the current SOC or DOD (determined in advance by an arbitrary method including the estimation method according to the present invention or a conventional method; for example, may be determined by the system in FIG. 2 and transmitted as data to the health evaluation unit in advance, or the SOC or DOD may be estimated by the health evaluation unit itself functioning as the complex impedance characteristic comparison unit illustrated in FIG. 2. In the estimation by the health evaluation unit itself, similarly to the system in FIG. 2, whether the secondary battery is connected with the load or the charger is notified by, for example, a signal transmitted to the health evaluation unit from the switching control circuit configured to switch the connection) of the secondary battery with the real part (or the resistance component) of the complex impedance at the point A or B determined as described above on the complex impedance characteristic curve obtained from the measured values of the current complex impedance.

In a possible specific example of the health evaluation, it is determined that the health of the battery has degraded when the real part (or the resistance component) of the complex impedance at the point A or B has decreased from that in the past, and it is determined that the health has not changed when the real part (or the resistance component) of the complex impedance at the point A or B is same as that in the past. A specific aspect of the health evaluation is arbitrary. For example, it may be determined that the health has significantly degraded with a high risk of short circuit, in particular, when the current real part (or the resistance component) has decreased by a certain fraction or more as compared to the real part (or the resistance component) of the complex impedance at the point A or B determined for an unused battery (stored in the memory of the health evaluation unit in advance).

A signal representing a result of the health determination is transmitted from the health evaluation unit to an operation control unit (including, for example, a processor, a memory, and a control/communication circuit). The operation control unit controls operation of the secondary battery based on this determination result. For example, when the operation control unit has received a determination result that the real part (or the resistance component) of the complex impedance at the point A or B has decreased and the health has degraded, the operation control unit stops the operation of the secondary battery by disconnecting the connection of the secondary battery with the load or the charger. In another exemplary control, the operation control unit may stop the operation of the secondary battery when having received a determination result indicating that the real part (or the resistance component) of the complex impedance at the point A or B has decreased by a certain fraction or more, or may restrict the operation by disconnecting the connection only with part of the load or charger when the decrease of the real part (or the resistance component) is less than the certain fraction.

In this manner, the battery can be safely operated by evaluating the health of the battery and controlling operation of the battery in accordance with a determination result to, for example, prevent short circuit from occurring.

In the above description, a complex impedance characteristic curve is produced by the health determination unit, but this processing may be performed by the complex impedance characteristic determination unit. Other data processing, data storage, and the like may be performed by any circuit unit as far as feedback control similar to the above-described feedback control can be performed. Each circuit unit may be consisted of a plurality of circuit units or may be configured as a single integrated device. Alternatively, a plurality of circuit units such as the complex impedance characteristic determination unit and the health evaluation unit may be integrated as a single device.

INDUSTRIAL APPLICABILITY

Accurate determination of the state of charge of a battery and the degradation tendency of the health thereof, reflection of them to control, and safe operation of the battery have been required for a long time in industry. The technology of the present invention has wide applications to achieve a society with improved energy use efficiency and improve the sustainability of human beings.

The invention claimed is:

1. A method for estimating a state of charge or depth of discharge of a battery of which the state of charge or depth of discharge is unknown, the method comprising:
   measuring a voltage applied to the battery;
   measuring a current flowing through the battery;
   calculating, from the measured voltage and current, complex impedance between positive and negative electrodes of the battery corresponding to a frequency;
   determining, based on respective complex impedances calculated corresponding to respective ones of a plurality of frequencies, frequency dependency of the complex impedance corresponding to the unknown state of charge or depth of discharge of the battery; and
   estimating the unknown state of charge or depth of discharge of the battery by comparing the frequency dependency of the complex impedance corresponding to the unknown state of charge or depth of discharge with frequency dependency of complex impedance determined in advance corresponding to a known state of charge or depth of discharge of the battery at a frequency range equal to or lower than approximately 100 mHz.

2. The method according to claim 1, wherein the estimating of the unknown state of charge or depth of discharge of the battery is performed by comparing the frequency dependency of the complex impedance corresponding to the unknown state of charge or depth of discharge with the frequency dependency of the complex impedance determined in advance corresponding to a known state of charge or depth of discharge of the battery at a frequency range equal to or lower than approximately 10 mHz.

3. The method according to claim 2, wherein the frequency dependency of the complex impedance determined in advance corresponding to the known state of charge or depth of discharge of the battery is a plurality of frequency dependencies corresponding to known direct-current resistances, where respective ones of the plurality of frequency dependencies are determined corresponding to respective ones of a plurality of direct-current resistances measured in advance for the battery;
   the method further comprising estimating a degradation state of the battery by measuring direct-current resistance of the battery, wherein the estimating of the unknown state of charge or depth of discharge of the battery is performed by comparing the frequency dependency of the complex impedance corresponding to the unknown state of charge or depth of discharge with, among the plurality of frequency dependencies corresponding to known direct-current resistances, the frequency dependency of the complex impedance corresponding to a direct-current resistance closest to the direct-current resistance of the battery, at a frequency equal to or lower than approximately 100 mHz.

4. The method according to claim 2, further comprising controlling charging by a charger connected with the battery or controlling electric power consumption at a load connected with the battery depending on the estimated state of charge or depth of discharge of the battery.

5. The method according to claim 1, wherein the frequency dependency of the complex impedance determined in advance corresponding to the known state of charge or depth of discharge of the battery is a plurality of frequency dependencies corresponding to known direct-current resistances, where respective ones of the plurality of frequency dependencies are determined corresponding to respective ones of a plurality of direct-current resistances measured in advance for the battery;
   the method further comprising estimating a degradation state of the battery by measuring direct-current resistance of the battery, wherein the estimating of the unknown state of charge or depth of discharge of the battery is performed by comparing the frequency dependency of the complex impedance corresponding to the unknown state of charge or depth of discharge with, among the plurality of frequency dependencies corresponding to known direct-current resistances, the frequency dependency of the complex impedance corresponding to a direct-current resistance closest to the direct-current resistance of the battery, at a frequency equal to or lower than approximately 100 mHz.

6. The method according to claim 5, further comprising controlling charging by a charger connected with the battery or controlling electric power consumption at a load connected with the battery depending on the estimated state of charge or depth of discharge of the battery.

7. The method according to claim 2 further comprising:
   measuring differential capacity of the battery, the differential capacity being a ratio of a change in electric charge to a change of voltage of the battery or being a ratio of a change in electric charge to a differential of potential of the battery; and
   estimating the unknown state of charge or depth of discharge of the battery by comparing the measured differential capacity with a plurality of differential capacities of the battery, the plurality of differential capacities being measured in advance for respective ones of a plurality of known states of charge or depths of discharge.

8. The method according to claim 5 further comprising:
   measuring differential capacity of the battery, the differential capacity being a ratio of a change in electric charge to a change of voltage of the battery or being a ratio of a change in electric charge to a differential of potential of the battery; and
   estimating the unknown state of charge or depth of discharge of the battery by comparing the measured differential capacity with a plurality of differential capacities of the battery, the plurality of differential capacities being measured in advance for respective ones of a plurality of known states of charge or depths of discharge.

9. The method according to claim 1, further comprising controlling charging by a charger connected with the battery or controlling electric power consumption at a load connected with the battery depending on the estimated state of charge or depth of discharge of the battery.

10. The method according to claim 1 further comprising:
    measuring differential capacity of the battery, the differential capacity being a ratio of a change in electric charge to a change of voltage of the battery or being a ratio of a change in electric charge to a differential of potential of the battery; and
    estimating the unknown state of charge or depth of discharge of the battery by comparing the measured differential capacity with a plurality of differential capacities of the battery, the plurality of differential capacities being measured in advance for respective ones of a plurality of known states of charge or depths of discharge.

11. An apparatus for estimating a state of charge or a depth of discharge of a battery of which the state of charge or depth of discharge is unknown, the apparatus comprising:
a voltmeter configured to measure a voltage applied to the battery;
an ammeter configured to measure a current flowing through the battery; and
a processor and a non-transitory memory, the processor configured to
calculate, from the measured voltage and current, complex impedance between positive and negative electrodes of the battery corresponding to a frequency;
determine, based on respective complex impedances calculated corresponding to respective ones of a plurality of frequencies, frequency dependency of the complex impedance corresponding to the unknown state of charge or depth of discharge of the battery; and
estimate the unknown state of charge or depth of discharge of the battery by comparing the frequency dependency of the complex impedance corresponding to the unknown state of charge or depth of discharge with frequency dependency of complex impedance determined in advance and stored in the non-transitory memory corresponding to a known state of charge or depth of discharge of the battery at a frequency range equal to or lower than approximately 100 mHz.

12. The apparatus according to claim 11, wherein the processor is configured to estimate the unknown state of charge or depth of discharge of the battery by comparing the frequency dependency of the complex impedance corresponding to the unknown state of charge or depth of discharge with frequency dependency of complex impedance determined in advance corresponding to a known state of charge or depth of discharge of the battery at a frequency range equal to or lower than approximately 10 mHz.

13. The apparatus according to claim 12, wherein the frequency dependency of the complex impedance determined in advance corresponding to the known state of charge or depth of discharge of the battery is a plurality of frequency dependencies corresponding to known direct-current resistances, where respective ones of the plurality of frequency dependencies are determined corresponding to respective ones of a plurality of direct-current resistances measured in advance for the battery;
the processor is further configured to calculate direct-current resistance of the battery, and the processor is configured to estimate the degradation state of the battery,
wherein the estimating of the unknown state of charge or depth of discharge of the battery by the processor is performed by comparing the frequency dependency of the complex impedance corresponding to the unknown state of charge or depth of discharge with, among the plurality of frequency dependencies corresponding to known direct-current resistances, the frequency dependency of the complex impedance corresponding to a direct-current resistance closest to the direct-current resistance of the battery, at a frequency equal to or lower than approximately 100 mHz.

14. The apparatus according to claim 12, wherein the processor is further configured to control charging by a charger connected with the battery or configured to control electric power consumption at a load connected with the battery depending on the estimated state of charge or depth of discharge of the battery.

15. The apparatus according to claim 12 wherein
the processor is further configured to calculate differential capacity of the battery, the differential capacity being a ratio of a change in electric charge to a change of voltage of the battery or being a ratio of a change in electric charge to a differential of potential of the battery; and the processor is further configured to estimate the unknown state of charge or depth of discharge of the battery by comparing the calculated differential capacity with a plurality of differential capacities of the battery, the plurality of differential capacities being measured in advance for respective ones of a plurality of known states of charge or depths of discharge.

16. The apparatus according to claim 11, wherein the frequency dependency of the complex impedance determined in advance corresponding to the known state of charge or depth of discharge of the battery is a plurality of frequency dependencies corresponding to known direct-current resistances, where respective ones of the plurality of frequency dependencies are determined corresponding to respective ones of a plurality of direct-current resistances measured in advance for the battery;
the processor is further configured to calculate direct-current resistance of the battery, and to estimate the degradation state of the battery,
wherein the estimating of the unknown state of charge or depth of discharge of the battery by the processor is performed by comparing the frequency dependency of the complex impedance corresponding to the unknown state of charge or depth of discharge with, among the plurality of frequency dependencies corresponding to known direct-current resistances, the frequency dependency of the complex impedance corresponding to a direct-current resistance closest to the direct-current resistance of the battery of which the state of charge or depth of discharge is unknown, at a frequency equal to or lower than approximately 100 mHz.

17. The apparatus according to claim 16, wherein the processor is further configured to control charging by a charger connected with the battery or controlling electric power consumption at a load connected with the battery depending on the estimated state of charge or depth of discharge of the battery.

18. The apparatus according to claim 16 wherein
the processor is further configured to calculate differential capacity of the battery, the differential capacity being a ratio of a change in electric charge to a change of voltage of the battery or being a ratio of a change in electric charge to a differential of potential of the battery, and
the processor is further configured to estimate the unknown state of charge or depth of discharge of the battery by comparing the calculated differential capacity with a plurality of differential capacities of the battery, the plurality of differential capacities being measured in advance for respective ones of a plurality of known states of charge or depths of discharge.

19. The apparatus according to claim 11, wherein the processor is further configured to control charging by a charger connected with the battery or control electric power consumption at a load connected with the battery depending on the estimated state of charge or depth of discharge of the battery.

20. The apparatus according to claim 11 wherein
the processor is further configured to calculate differential capacity of the battery, the differential capacity being a ratio of a change in electric charge to a change of voltage of the battery or being a ratio of a change in electric charge to a differential of potential of the battery, and
the processor is further configured to estimate the unknown state of charge or depth of discharge of the battery by comparing the calculated differential capacity with a plurality of differential capacities, the plurality of differential capacities being measured in advance for the respective ones of the plurality of known states of charge or depths of discharge.

* * * * *